(12) United States Patent
Miki (10) Patent No.: US 7,436,725 B2
(45) Date of Patent: Oct. 14, 2008

(54) DATA GENERATOR HAVING STABLE DURATION FROM TRIGGER ARRIVAL TO DATA OUTPUT START

(75) Inventor: Yasuhiko Miki, Tokyo (JP)

(73) Assignee: Tektronix International Sales GmbH, Rheinfall (CH)

( * ) Notice: Subject to any disclaimer, the term of this patent is extended or adjusted under 35 U.S.C. 154(b) by 58 days.

(21) Appl. No.: 11/738,485

(22) Filed: Apr. 21, 2007

(65) Prior Publication Data
US 2007/0247927 A1 Oct. 25, 2007

(51) Int. Cl.
*G11C 7/16* (2006.01)
*H03M 9/00* (2006.01)

(52) U.S. Cl. .................. 365/219; 365/220; 365/221; 365/194; 365/236; 365/233.11; 365/233.12; 365/233.14; 341/147; 341/101

(58) Field of Classification Search ............... 365/219, 365/220, 221, 194, 233.11, 233.12, 233.14, 365/233.1, 236; 341/101, 100, 147
See application file for complete search history.

(56) References Cited

U.S. PATENT DOCUMENTS 4,692,886 A * 9/1987 Miki et al. ............. 708/272
7,295,139 B2 * 11/2007 Fujisawa ................. 341/100
2007/0247927 A1* 10/2007 Miki ................... 365/189.04

FOREIGN PATENT DOCUMENTS

JP 2007-295132 A * 11/2007

* cited by examiner

*Primary Examiner*—Andrew Q Tran
(74) *Attorney, Agent, or Firm*—William K. Bucher (57) ABSTRACT

A data generator has stable duration from trigger arrival to substantial data output start. A memory provides parallel data according to a divided clock. An address counter provides the same address to the memory until a trigger signal arrives and starts increasing the address after the trigger signal. A hexadecimal counter counts a clock that is faster than the divided clock as the counted number circulates every one period of the divided clock. A trigger information latch latches the counted number of the counter when the trigger signal arrives and provides it to a MUX. The MUX selects data in a pair of the parallel data provided at first and second inputs $I_1$ and $I_2$ to produce rearranged parallel data bits according to the latched counted number. A parallel to serial converter receives the rearranged parallel data to convert it to serial data according to the clock.

11 Claims, 7 Drawing Sheets

DATA GENERATOR HAVING STABLE DURATION FROM TRIGGER ARRIVAL TO DATA OUTPUT START

FIELD OF THE INVENTION

The present invention relates to a data generator for generating serial data, and more particularly to a data generator that reduces time fluctuation of duration from trigger arrival to substantial data output start.

BACKGROUND OF THE INVENTION

A data generator stores arbitrary data patterns in a memory and reads the data patterns out to generate output data. To generate high speed data patterns, the pattern data is read out of the memory in parallel and then converted to serial data. The generated data may be directly used as digital data. Alternatively, multiple serial data outputs may be combined as fast parallel data that are converted to an analog signal by digital to analog conversion. Such an apparatus is called a signal generator. The AWG series of Arbitrary Waveform Generators, manufactured by Tektronix, Inc., U.S.A., are an example of these types of signal generators.

One of usages of the signal generator is to provides signals that represent signals of an unfinished circuit block under development. The signal generator provides a finished circuit block with a signal that the unfinished circuit block will provide in response to a given signal from the finished circuit block. This allows a user to check operations of the finished circuit blocks even if other circuit blocks have not been finished. As described, the signal generator provide an output signal in response to the given signal. The given signal triggers the signal generator to output its signal so that the given signal is called a trigger signal hereinafter. The signal generator includes a data generator having circuitry for implementing the data generation in response to the trigger signal, which has been realized in two types as described below.

Figure 1:
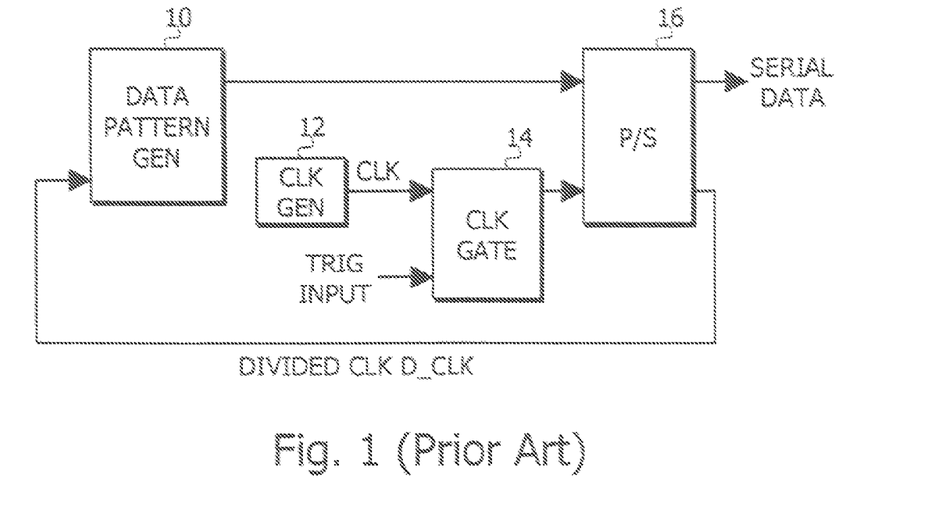
FIG. 1 is a block diagram of an example of a conventional data generator.

FIG. 1 is a block diagram of an example of a conventional data generator. A clock generator 12 provides a continuous clock CLK to a clock gate circuit 14. The clock gate circuit 14 enables the clock CLK in response to a trigger signal. A parallel to serial converter 16 operates according to the gated clock. The parallel to serial converter 16 provides a divided clock by dividing the clock CLK. The division ratio of the parallel to serial converter 16 is based on the bit number of the parallel data. For example, if the parallel data has 16 bits the division ratio may be 16. A data pattern generator 10 operates according to the divided clock. The divided clock is enabled by the trigger signal and then the data pattern generator 10 provides the parallel data in response to the trigger signal.

Figure 2:
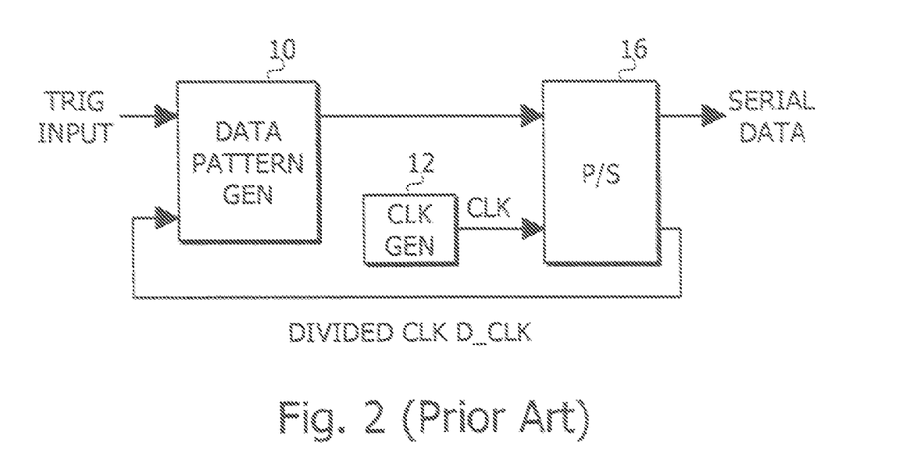
FIG. 2 is a block diagram of another example of a conventional data generator.

FIG. 2 is a block diagram of another example of a conventional data generator wherein blocks corresponding to those of FIG. 1 have the same numbers. The clock generator 12 provides a continuous clock CLK to a parallel to serial converter 16. The parallel to serial converter 16 continuously provides a divided clock by dividing the clock CLK. The data pattern generator 10 has a trigger input and starts to provide parallel data for generating serial data when it receives the trigger signal. The parallel to serial converter 16 converts the parallel data to the serial data.

In the circuit of FIG. 1, the clock CLK (or divided clock) is provided after the trigger signal input and, as a result, the phase of the clock CLK is delayed relative to the trigger signal input. As a method of removing a delay, a DLL (Delay Locked Loop) may be used for intentionally delaying the phase of the clock CLK up to the start phase of the next cycle as if there is no delay. It, however, requires that the clock should be continuously provided so that A DLL cannot be applicable to the case of FIG. 1 because the clock CLK or divided clock is gated by the trigger signal.

Figure 3:
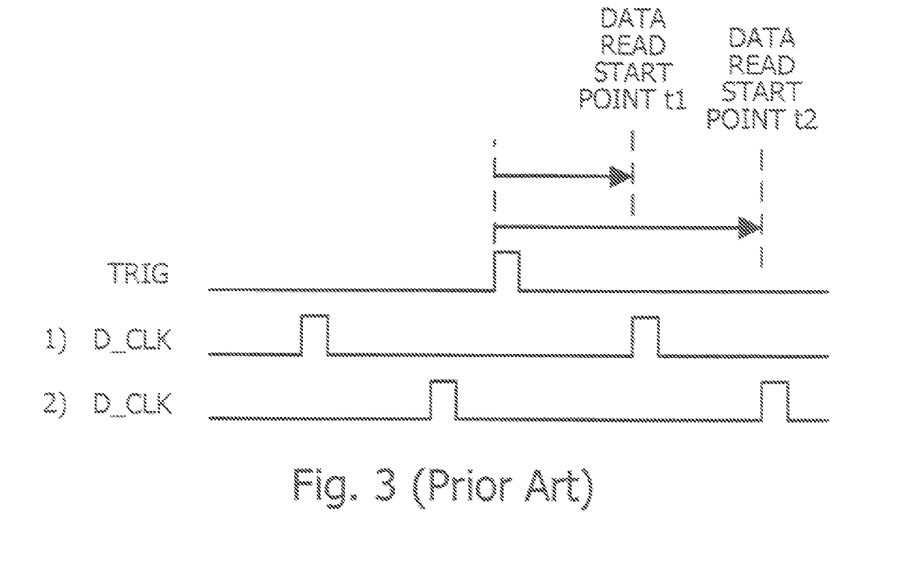
FIG. 3 is a timing chart showing a relationship between trigger arrival and divided clock.

On the other hand, the clock CLK or divided clock is continuously provided in the case of FIG. 2 and then the DLL is applicable to speed up a logic circuit operation as described above. It, however, starts to output the serial data according to the divided clock, with the duration from the trigger arrival to the serial data output fluctuating because the period of the divided clock is long. FIG. 3 is a timing chart showing a relationship between trigger arrival and the divided clock. For example, if the parallel to serial converter 16 has a 16 to 1 conversion ratio the divided clock has a period 16 times longer period than the clock CLK. This means that the serial data output time point relative to the trigger signal has uncertainty that is 16 times longer than the period of the clock CLK.

Figure 4:
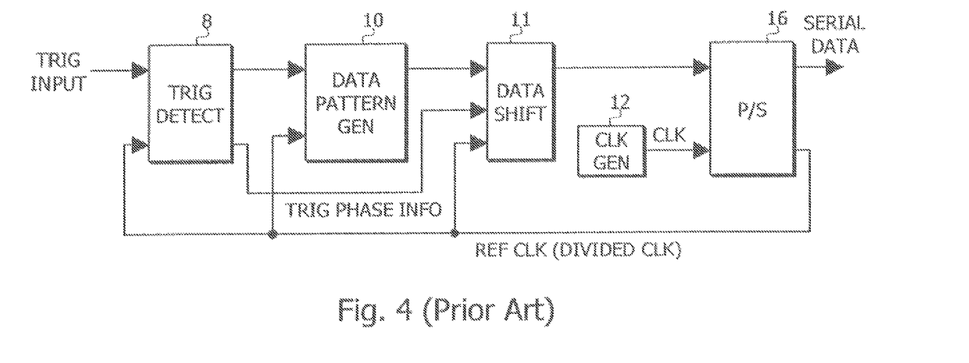
FIG. 4 is a block diagram of an example of a conventional data generator.
Figure 5:
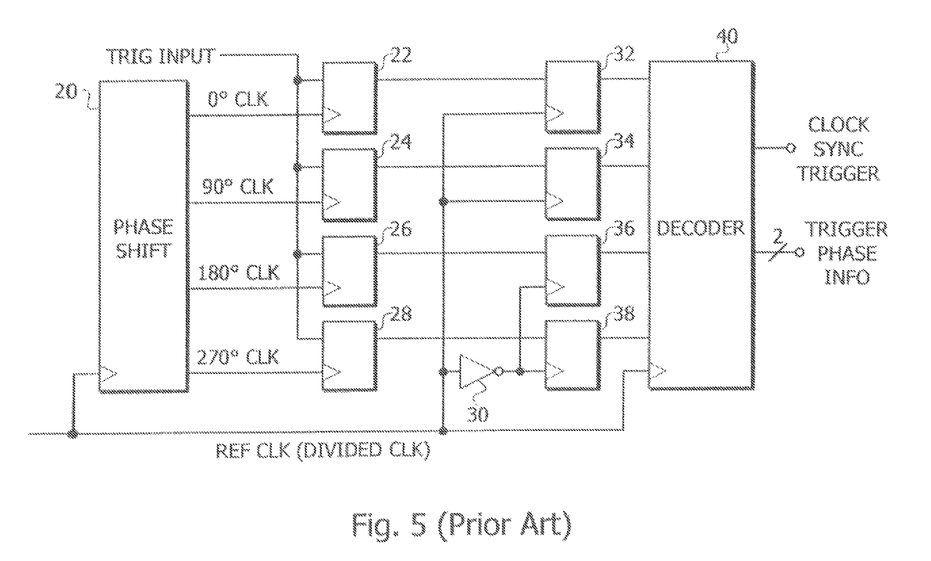
FIG. 5 is a block diagram of a trigger detector of FIG. 4.

Japanese patent application No. 2005-49069 corresponding to US2006/0202875 discloses a circuit that reduces the uncertainty of the serial data output time point to the trigger signal while having the advantage using the logic circuit speed-up by DLL. FIG. 4 is a functional block diagram disclosed in the above Japanese patent application and FIG. 5 is a functional block diagram of a trigger detector 8. In this invention, a phase shifter 20 produces four divided clocks that are shifted in phase relative to each other and a trigger arrival time is detected using them. Parallel data is rearranged based on the detected phase information and then converted to serial data.

It is desirable that duration from the trigger arrival to the data output start is constant. Further, it is necessary that the circuit continuously operates even before the trigger signal arrival because of increased clock speeds. The present invention provides an alternative solution to the invention disclosed in the above Japanese patent application.

SUMMARY OF THE INVENTION

The present invention relates to a data generator that reduces fluctuation of duration from trigger signal arrival to substantial data output start. A memory including RAM, provides parallel data according to a first clock. An address generating means provides addresses to the memory. A delaying means delays the parallel data for one period of the first clock. A counting means counts a second clock that is faster than the first clock to provide a counted number that circulates every period of the first clock. The first clock may be generated by dividing the second clock. A latch means latches a counted number of the counting means when it receives a trigger signal and provides it to a data rearranging means. The data rearranging means receives the parallel data from the memory and from the delaying means and rearranges data to produce a set of rearranged parallel data according to the latched counted number. Finally, a parallel to serial conversion means converts the rearranged parallel data to serial data. It would be preferable that the address generating means provides the same address to the memory means before the trigger signal arrives.

The present invention rearranges data from the memory and the delaying means that is read out according to the first clock depending on time relationship between a trigger signal and the first clock and then converts the rearranged parallel data to serial data. Therefore it reduces time fluctuation of duration from the trigger arrival to substantial data output start in the serial data though the period of the first clock that the parallel data is read out is longer than that of the second clock that is used for serial data transfer. The memory provides the same data until the trigger signal arrives by not increasing the address to make the data output substantially idles or stops while the circuits operate, which provides a more stable operation than circuits that start to operate after the trigger arrives. The present invention provides fast circuit operation and may include clock phase adjustment using DLL and the like.

The objects, advantages and other novel features of the present invention are apparent from the following detailed description when read in conjunction with the appended claims and attached drawings.

DETAILED DESCRIPTION OF THE INVENTION

Figure 6:
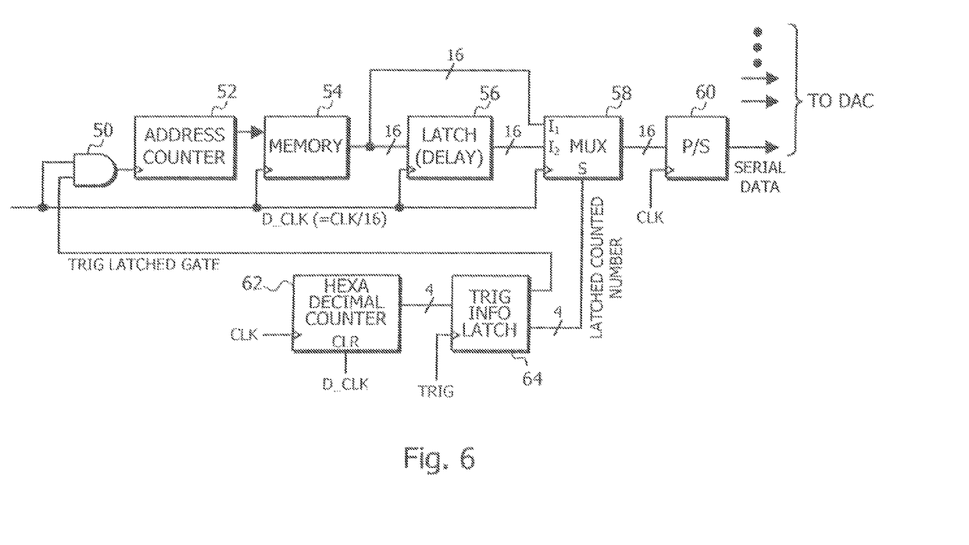
FIG. 6 is a block diagram of an embodiment of a data generator according to the present invention.

FIG. 6 is a block diagram of an embodiment of a data generator according to the present invention wherein a CPU (not shown) controls operation of the data generator. An address counter 52 provides addresses to a memory 54 according to a divided clock D_CLK wherein the divided clock D_CLK is produced by dividing a clock CLK. The divide ratio for the CLK is a function of the number of parallel bits in the parallel data stored in the memory 54. The clock CLK is a reference clock for serial data generation by a parallel to serial converter (P/S) 60 as described below. If a trigger information latch 64 receives a trigger signal, a trigger latch gate signal becomes H (High) to make a gate 50 open and the divided clock D_CLK is provided to the address counter 52. That is, the address counter 52 provides the same address to the memory 54 before receiving the trigger signal and increases the address following the trigger arrival.

The memory 54 stores user desired data at each address as parallel data and provides it to latch 56 and multiplexer (MUX) 58 according to the divided clock D_CLK wherein the parallel data is 16 bits as an example. The latch 56 latches the parallel data according to the divided clock D_CLK and provides the parallel data to the multiplexer (MUX) 58. The multiplexer (MUX) 58 receives the parallel data from the memory 54 at a first input I$_1$ and the parallel data from the latch 56 at a second input I$_2$. The parallel data at the second input I$_2$ is delayed one clock of the divided clock D_CLK relative to the parallel data at the first input I$_1$.

A hexadecimal counter 62 is cleared by the divided clock D_CLK and counts the clock CLK to provide the counted number to the trigger information latch 64. Alternatively, the hexadecimal counter 62 may be cleared by divided clock D_CLK only when it is powered on or reset. Since the divided clock D_CLK is produced by dividing the clock CLK by 16, the counted number of the hexadecimal counter 62 circulates with a period of the divided clock D_CLK. The trigger information latch 64 receives the trigger signal to make the gate signal "H" and latches the counted number of the hexadecimal counter 62. The latched counted number is provided to the multiplexer 58. The latched counted number can be seen as a value indicating when the trigger signal occurs during the period of the divided clock D_CLK with resolution of one-sixteenth of the period of the divided clock D_CLK. The multiplexer 58 produces 16 bit rearranged parallel data by selecting 16 bits from 32 bits from the first and second input I$_1$ and I$_2$, and rearranging them according to the latched counted number from the trigger information latch 64. The parallel to serial converter 60 converts the rearranged parallel data from the multiplexer 58 to the serial data according to the clock CLK. A plurality of data generators may be used to generate multiple serial data outputs. The multiple serial data outputs may be treated as parallel data and converted to an analog signal by a digital to analog converter (DAC). This enables the generation of a high frequency analog signal since the bit rates of the multiple serial data outputs are increased over the stored parallel data in the memory 54. Alternately, the serial data of the data generator may be provided to a circuit under test as is.

Figure 7:
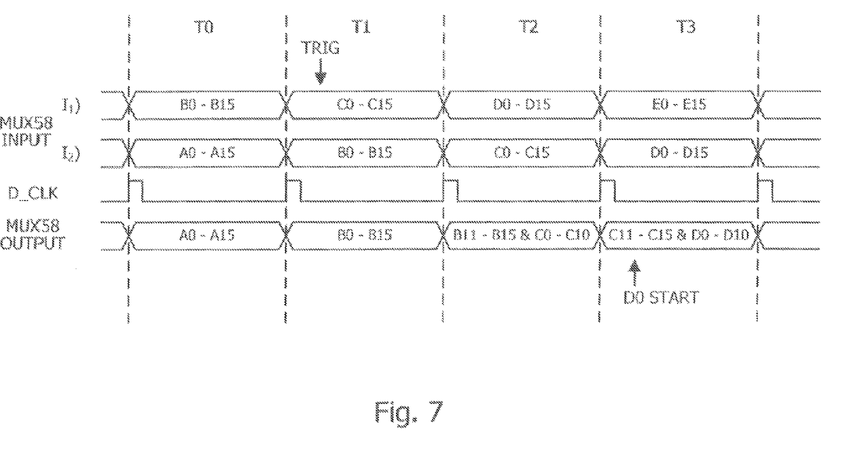
FIG. 7 is a timing chart showing a relationship between trigger arrival and substantial data output start.
Figure 8:
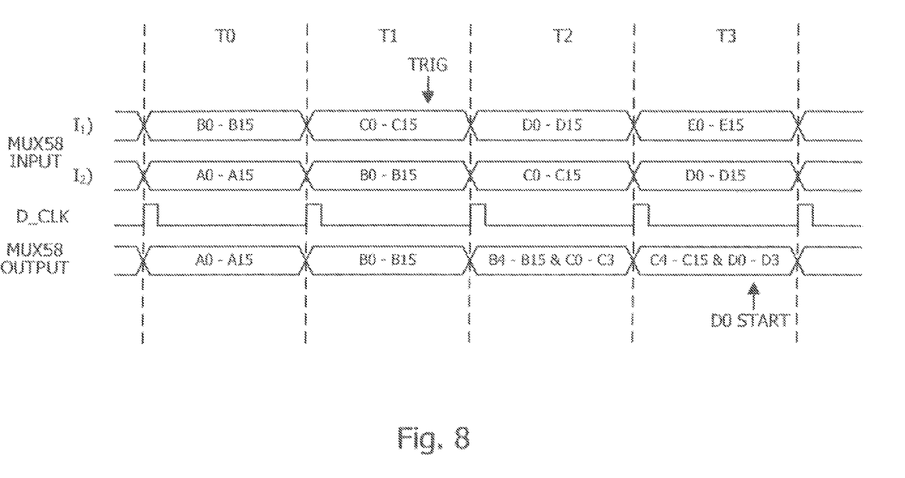
FIG. 8 is a timing chart showing another relationship between trigger arrival and substantial data output start.

FIGS. 7 and 8 are timing charts showing timing relationships between trigger signals and input/output data of the multiplexer 58 wherein sets of parallel data are sequentially provided as A0-A15, B0-B15, C0-C15 . . . in alphabetical order from the memory 54 for convenience of explanation. Periods T0-T3 are periods of the divided clock respectively and each of them is equivalent to sixteen periods of the clock CLK (not shown for simplicity). In these cases, the trigger signals come during the period T1 for example.

In FIG. 7, the trigger signal specifically arrives at a fifth clock from the beginning of the period T1 for example. At this moment, the hexadecimal counter 62 outputs "five" as a counted number in decimal representation and hence the trigger information latch 64 latches the counted number five to continuously provide the latched counted number five to the multiplexer 58 and, at the same time, turns the trigger latch gate signal to "H" wherein an initial value of the latched counted number is zero. The multiplexer 58 selects five bits of B11-B15 data from the parallel data provided at the second input I$_2$ according to the latched counted number five and selects 11 bits of C0-C10 data from the parallel data provided at the first input I$_1$ to rearrange the parallel data and produce a new rearranged 16 bit parallel data "B11-B15 and C0-C10" during the period T2. The same rearrangement relationship is kept in the periods following the period T2.

Until the trigger arrives, the address counter 52 provides the same address to the memory 54. The parallel data output from the memory 54 is the same at I$_1$ and I$_2$, i.e. A0-A15, B0-B15 and C0-C15, even if the alphabets are different. Therefore, this status of the data output is deemed to be substantially stopped, or idling though the circuits are working continuously. Due to the trigger signal arrival, the gate 50 opens to increase the address and then different data is provided from the parallel data of D0-D15, which is the substantial start of the data output.

In FIG. 8, the trigger signal specifically arrives at a twelfth clock from the beginning of the period T1 as another example. The latched counted number becomes 12 and the multiplexer 58 rearranges the parallel data according to this number. Specifically, the multiplexer 58 selects 12 bits of B4-B15 data from the parallel data provided at the second input I$_2$ according to the latched counted number 12 and selects remaining four bits of C0-C3 data from the parallel data provided at the first input I₁ to rearrange the parallel data and produce a new rearranged 16 bit parallel data "B4-B15 and C0-C3" during the period T2.

FIGS. 7 and 8 show that a time difference between the trigger arrival time point and the D0 data starting time point is constant, or two periods of the divided clock, that is, 32 periods of the clock CLK in the both cases. In this case, fluctuation (jitter) of this time difference can be within one period of the clock CLK.

Prior to the trigger signal, the parallel data from the MUX 58 and the resultant output serial data has the same content which may be set by the user. For example, if an analog signal is eventually generated by a DAC and the first voltage is 0.5 volts, then all data of the parallel data may correspond to the 0.5 volts. It allows that the data generator continuously operates receiving the divided clock D_CLK or clock CLK while the data output is deemed to be substantially stopped or idling. When a trigger signal arrives it can start to output the substantial data (D0 data in the above examples) after the constant duration that may have an error within only one period of the clock CLK. The circuits operate continuously before the trigger arrival, which allows stable operation and phase adjustment by DLL to make the circuits operate fast.

Although the invention has been disclosed in terms of the preferred and alternative embodiments disclosed herein, those skilled in the art will appreciate that modifications and improvements may be made without departing from the scope of the invention. For example, a counter may count up every 2, 4 or 8 (a divisor of the bit number of the parallel data) of the clock CLK in place of the hexadecimal counter 62. In other words, it may count up with a period that is shorter than that of the divided clock but longer than that of the clock CLK. This leads to larger fluctuation (jitter) of the duration from the trigger arrival to the substantial data (D0 in the above example) output start than that of the described embodiment but has an advantage of simplifying the circuits such as the multiplexer 58.

What is claimed is:

1. A data generator comprising:
    a memory for providing parallel data according to a first clock;
    means for providing addresses to the memory;
    means for counting a second clock that is faster than the first clock to provide a counted number that circulates for every one period of the first clock;
    means for latching the counted number of the counting means at the occurrence of a trigger signal;
    means for delaying the parallel data from the memory for one period of the first clock;
    means for rearranging the data received from the memory and from the delaying means to produce a set of rearranged parallel data according to the latched counted number; and
    means for converting the rearranged parallel data to serial data.

2. The data generator as recited in claim 1 wherein the address providing means provides the same address to the memory before the trigger signal comes.

3. The data generator as recited in claim 1 wherein the memory provides the parallel data having the same data as data that is provided when the trigger signal comes before the trigger signal comes.

4. The data generator as recited in claim 1 wherein the first clock is generated by dividing the second clock.

5. The data generator as recited in claim 1 wherein the first clock is generated by dividing the second clock by the bit number of the parallel data.

6. The data generator as recited in claim 5 wherein the counting means counts up a divisor of the bit number of the parallel data.

7. A method for generating data comprising the steps of:
    generating parallel data according to a first clock;
    counting a second clock that is faster than the first clock to provide a counted number that circulates for every one period of the first clock;
    latching the counted number of the counting means when a trigger signal comes;
    delaying the parallel data from the memory for one period of the first clock using a delaying means;
    rearranging the parallel data received from the memory and from the delaying means to produce a set of rearranged parallel data according to the latched counted number; and
    converting the rearranged parallel data to serial data.

8. The method for generating data as recited in claim 7 wherein parallel data having the same data as data that is provided when the trigger signal comes is provided before the trigger signal comes.

9. The method for generating data as recited in claim 7 wherein the first clock is generated by dividing the second clock.

10. The method for generating data as recited in claim 7 wherein the first clock is generated by dividing the second clock by the bit number of the parallel data.

11. The method for generating data as recited in claim 10 wherein a divisor of the bit number of the parallel data is counted for producing the counted number in the counting step.

* * * * *